United States Patent
Duan et al.

(10) Patent No.: US 11,212,623 B2
(45) Date of Patent: Dec. 28, 2021

(54) PIEZOELECTRIC MEMS MICROPHONE

(71) Applicant: AAC ACOUSTIC TECHNOLOGIES (SHENZHEN) CO., LTD., Shenzhen (CN)

(72) Inventors: Lian Duan, Shenzhen (CN); Rui Zhang, Shenzhen (CN); Zhiyuan Chen, Shenzhen (CN)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 9 days.

(21) Appl. No.: 16/988,738

(22) Filed: Aug. 10, 2020

(65) Prior Publication Data

US 2021/0051415 A1 Feb. 18, 2021

(30) Foreign Application Priority Data

Aug. 16, 2019 (CN) .......................... 201910760698.X (51) Int. Cl.
| | | |
|---|---|---|
| *H04R 17/02* | (2006.01) | |
| *H04R 7/06* | (2006.01) | |
| *B81B 3/00* | (2006.01) | |
| *H04R 7/18* | (2006.01) | |

(52) U.S. Cl.
CPC ........... *H04R 17/02* (2013.01); *B81B 3/0051* (2013.01); *H04R 7/06* (2013.01); *H04R 7/18* (2013.01); *B81B 2201/0257* (2013.01); *B81B 2203/0127* (2013.01); *H04R 2201/003* (2013.01)

(58) Field of Classification Search
CPC ............... B81B 3/0021; B81B 3/0037; B81B 2201/0257; B81B 2203/0118; B81B 2203/0127; B81B 2203/04; H04R 7/06; H04R 7/18; H04R 17/02; H04R 17/025; H04R 19/005; H04R 31/003; H04R 2201/003; H04R 2207/023; H04R 2207/025
See application file for complete search history.

(56) References Cited

U.S. PATENT DOCUMENTS

| | | | | |
|---|---|---|---|---|
| 9,029,963 | B2* | 5/2015 | Sparks ................. | B81B 3/0018 257/416 |
| 9,055,372 | B2* | 6/2015 | Grosh .................... | H01L 41/27 |
| 10,710,874 | B2* | 7/2020 | Frischmuth ............ | H04R 19/02 |

* cited by examiner

*Primary Examiner* — Brian Ensey
(74) *Attorney, Agent, or Firm* — W&G Law Group (57) ABSTRACT

The invention provides a piezoelectric micro-electromechanical systems (MEMS) microphone having a base with a cavity, a piezoelectric diaphragm, and a limit element. The base has a ring base, and a support column. The piezoelectric diaphragm includes diaphragm sheets. Each diaphragm sheet have a fixing end connected with the support column and a free end suspended above the cavity. The limit element includes a limit part arranged apart from the piezoelectric diaphragm to limit the free ends in vibration directions of the diaphragm sheets, and an edge fixing plate connected with the outer edge of the limit part and arranged on the ring base. When the diaphragm sheets greatly deform upwards under impact force, deformation of the diaphragm sheets can be controlled, and the diaphragm sheets are protected to prevent the diaphragm sheets from breaking, thereby improving the stability of the piezoelectric MEMS microphone.

14 Claims, 7 Drawing Sheets

PIEZOELECTRIC MEMS MICROPHONE

FIELD OF THE PRESENT DISCLOSURE

The invention relates to the technical field of electroacoustic devices, in particular to a piezoelectric micro-electromechanical systems (MEMS) microphone.

DESCRIPTION OF RELATED ART

A micro-electromechanical system (MEMS) microphone is an electroacoustic transducer manufactured by a micromachining technology and has the characteristics of small volume, a good frequency response characteristic, low noise and the like. Along with the miniaturization and thinness of electronic devices, the MEMS microphone is widely applied to these devices.

The current MEMS microphone mainly comprises a condenser MEMS microphone and piezoelectric MEMS microphones. Compared with a traditional condenser MEMS microphone, the piezoelectric MEMS microphones have multiple advantages, including waterproof, dustproof, relatively high maximum output sound pressure (AOP) and the like. Different from the structure of a piezoelectric diaphragm of the condenser microphone, the piezoelectric diaphragm of the piezoelectric MEMS microphone is composed of a plurality of diaphragm sheets, one end of each diaphragm sheet is connected with a base; and the other end adopts a cantilever beam structure.

However, the diaphragm sheets are subjected to impact force when reliability tests, such as a dropping test and a blowing test are performed, and the piezoelectric diaphragm greatly deforms easily. Limited by the strength of materials of the piezoelectric diaphragm, irreversible damages, such as breakage and destroy to the diaphragm sheets are caused to greatly affect the stability of the piezoelectric MEMS microphone.

Therefore, in order to improve the stability of the piezoelectric MEMS microphone, it is necessary to provide a novel piezoelectric MEMS microphone to protect the diaphragm sheets, so as to solve the problems mentioned above.

SUMMARY OF THE INVENTION

One of the main objects of the present invention is to provide a piezoelectric MEMS microphone which is capable of preventing the diaphragm sheets from breaking, thereby improving the stability of the piezoelectric MEMS microphone.

The present invention accordingly provides a piezoelectric micro-electromechanical system (MEMS) microphone, comprising: a base with a cavity, including a ring base, and a support column arranged apart from the ring base and located at an inner side of the ring base; a piezoelectric diaphragm arranged on the base, including a plurality of diaphragm sheets each having a fixing end connected with the support column and a free end suspended above the cavity; a limit element covering outside the piezoelectric diaphragm, comprising a limit part arranged apart from the piezoelectric diaphragm for limiting the free ends in a vibration direction of the diaphragm, and an edge fixing plate connected with the outer edge of the limit part and arranged on the ring base; and a plurality of first through holes formed in the limit part for being arranged opposite to the cavity.

Further, the base further comprises a plurality of support beams; one ends of the support beams are connected with the support column, and the other ends are connected with the ring base for dividing the cavity into a plurality of sub-cavities.

Further, the piezoelectric diaphragm is of an integral structure; the piezoelectric diaphragm is provided with breathable seams extending from the outer edge thereof to the center of the piezoelectric diaphragm; and the breathable seams divide the piezoelectric diaphragm into diaphragm sheets.

Further, the limit part comprises a limit plate extending towards the support column from one side of the edge fixing plate far away from the ring base; and the limit plate covers a part of free ends.

Further, the limit part further comprises an intermediate fixing plate connected with the support column, and a plurality of support plates separately arranged directly opposite to the plurality of support beams in a manner of one-to-one correspondence; one end of each support plate is connected with the limit plate and the other end is connected with the intermediate fixing plate; each support plate covers a part of free ends; and the intermediate fixing plate, two adjacent support plates and the limit plate define one first through hole.

Further, the piezoelectric MEMS microphone includes one blocking board arranged between the intermediate fixing plate and the limit plate above each diaphragm sheet, wherein one end of each blocking board is connected with the intermediate fixing plate and the other end is connected with the limit plate.

Further, the piezoelectric MEMS microphone includes a gasket arranged between the base and the piezoelectric diaphragm, wherein the gasket comprises an edge fixing pad arranged in a surrounding manner along an extension direction of the ring base; the inner side of the edge fixing pad and the ring base form a base avoidance zone; a projection of the outer edge of the piezoelectric diaphragm on the base is positioned within the projection of the outer edge of the base avoidance zone on the base.

Further, the gasket further comprises a plurality of support pads laid along the plurality of support beams separately; two sides of the support pads along the axial directions thereof and the support beams form support beam avoidance zones respectively; and the side parts of the free ends separately cover the support beam avoidance zones.

Further, the gasket further comprises a middle fixed pad arranged between the intermediate fixing plate and the support column; one ends of the support pads are connected with the edge fixing pad and the other ends are connected with the middle fixed pad; and the middle fixed pad, two adjacent support pads and the edge fixing pad define one second through hole corresponding to one sub-cavity.

Further, the piezoelectric MEMS microphone includes a plurality of restraining elements, wherein one ends of the restraining elements are connected with the free ends; and the other ends are connected with the ring base or the limit element or the gasket.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENT

The present disclosure will hereinafter be described in detail with reference to an exemplary embodiment. To make the technical problems to be solved, technical solutions and beneficial effects of the present disclosure more apparent, the present disclosure is described in further detail together with the figure and the embodiment. It should be understood the specific embodiment described hereby is only to explain the disclosure, not intended to limit the disclosure.

What needs to be explained is that all directional indications (Such as upper, lower, inner, outer, top, bottom . . . ) in the embodiment of the invention are only used to explain the relative positional relationship between various components under a certain posture (as shown in the drawings), etc. If the specific posture changes, the directional indication will also change accordingly.

It should also be noted that when an element is referred to as being "fixed" or "disposed" on another element, the element may be directly on the other element or there may be intervening elements at the same time. When an element is called "connected" to another element, it may be directly connected to the other element or there may be intervening elements at the same time.

Referring to FIGS. 1-13, the embodiment of the invention provides a piezoelectric micro-electromechanical system (MEMS) microphone. The piezoelectric MEMS microphone comprises a base 10 with a cavity 11, a piezoelectric diaphragm 20 arranged on the base 10, and a limit element 30 covering outside the piezoelectric diaphragm 20. A plurality of first through holes 311 are formed in the limit element 30. An external sound signal is transferred from a sound hole and enters the piezoelectric MEMS microphone through the first through holes 311, and deformation of the piezoelectric diaphragm 20 is caused by sound pressure to generate a voltage change, so as to sense an acoustic signal. Meanwhile, under impact force, when diaphragm sheets 21 in the piezoelectric diaphragm 20 greatly deform upwards, limited by protection of the structure of the limit element 30, the deformation of the diaphragm sheets 21 can be controlled, and the diaphragm sheets 21 are protected to prevent the diaphragm sheets 21 from breaking, thereby improving the stability of the piezoelectric MEMS microphone.

Referring to FIGS. 1-7, the base 10 comprises a ring base 12, a support column 13 arranged at the inner side of the ring base 12 and arranged apart from the ring base 12, and a plurality of support beams 14 arranged at intervals along the circumferential direction of the support column 13. One ends of the support beams 14 are connected with the support column 13; and the other ends of the support beams 14 are connected with the ring base 12 to divide the cavity 11 into a plurality for sub-cavities 15 arranged at intervals along the circumferential direction of the support column 13. In the embodiment, the ring base 12 may be a 360-degree closed ring or may not be a complete ring.

Figure 1:
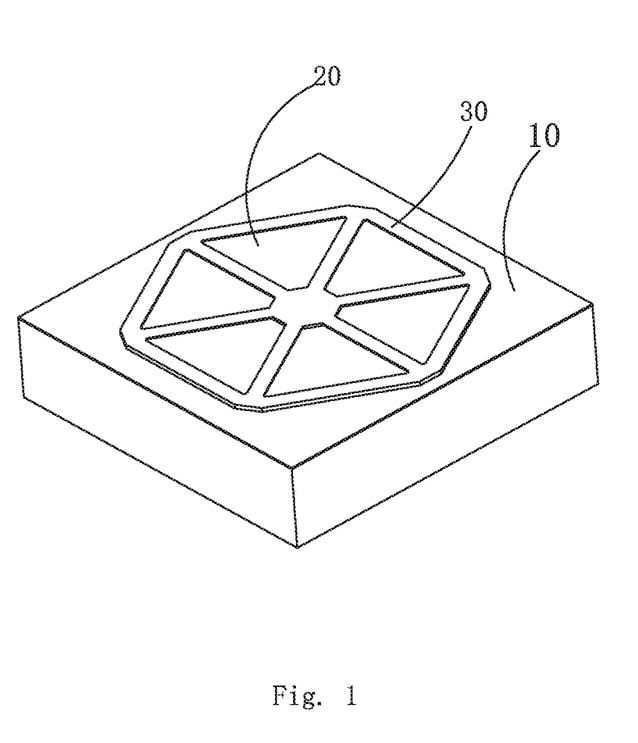
FIG. 1 is an isometric view of a piezoelectric microelectromechanical systems (MEMS) microphone provided by an embodiment of the invention.
Figure 2:
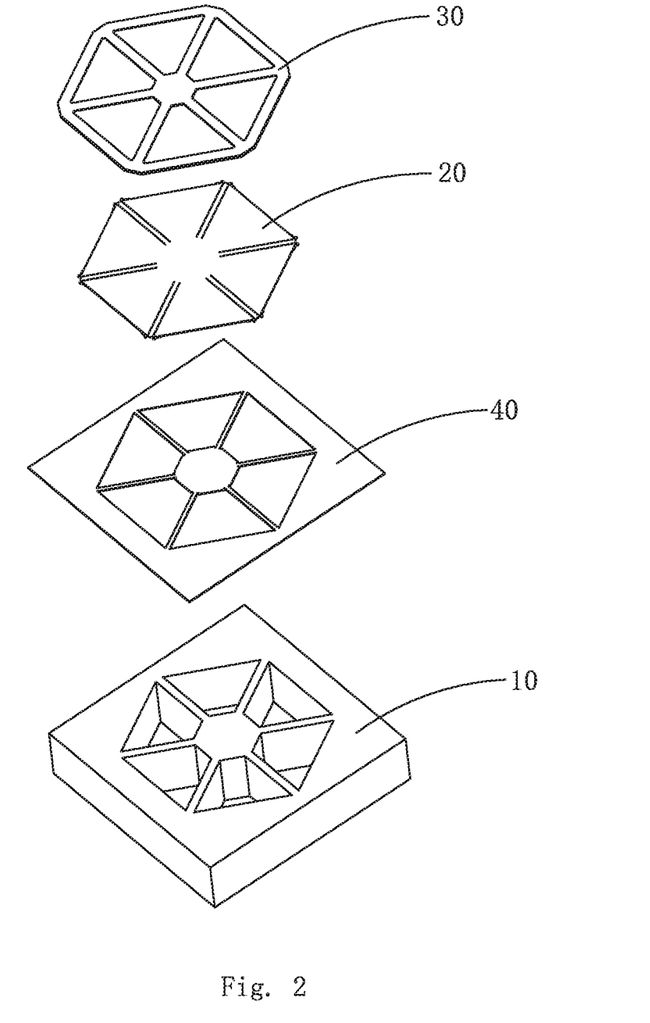
FIG. 2 is an exploded view of the piezoelectric MEMS microphone provided by the embodiment of the invention.
Figure 3:
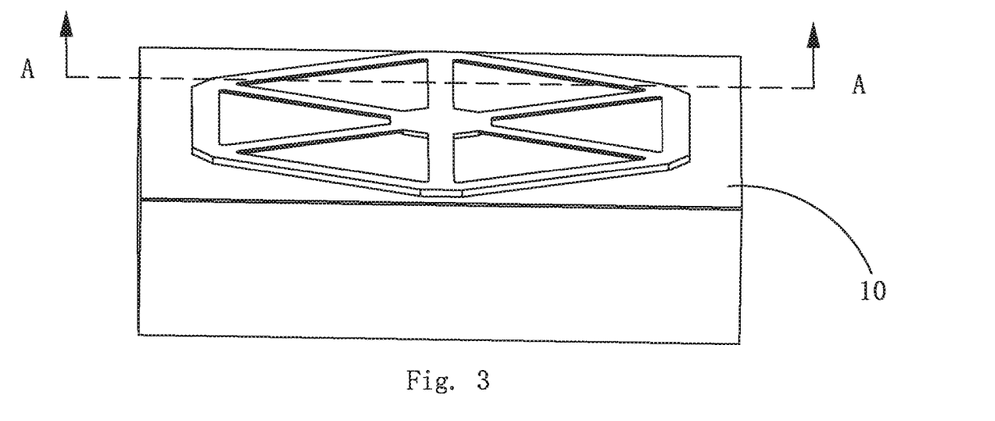
FIG. 3 is a top view of the piezoelectric MEMS microphone provided by the embodiment of the invention.
Figure 4:
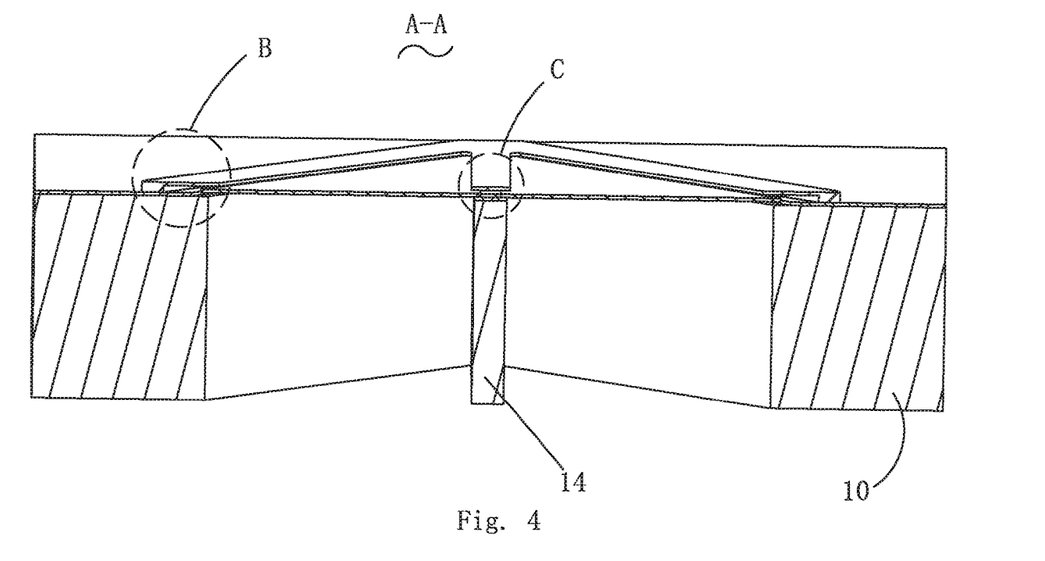
FIG. 4 is a cross-sectional view of the microphone taken along line A-A in FIG. 3.
Figure 5:
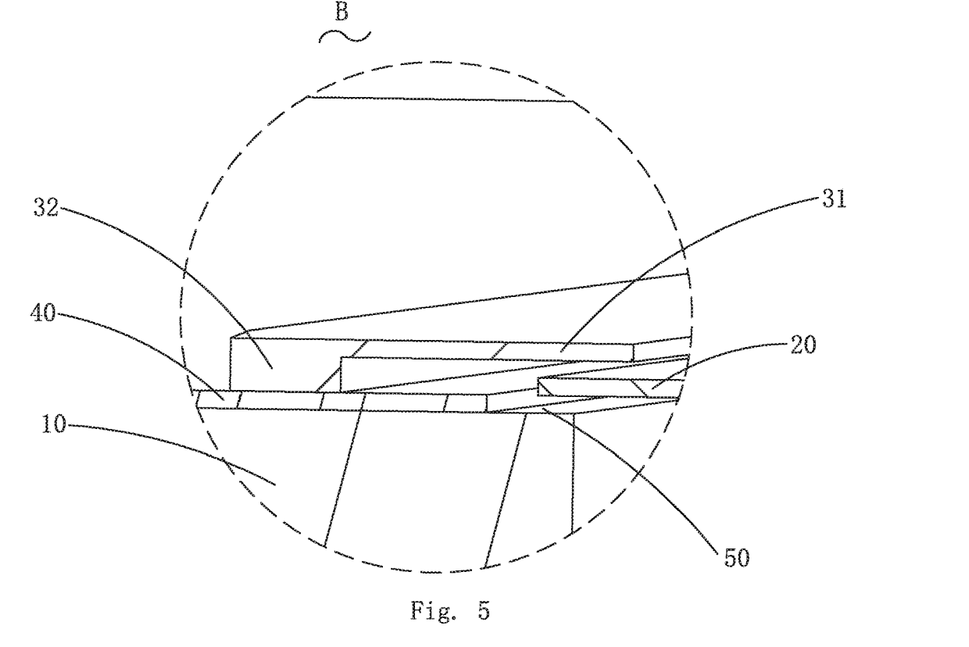
FIG. 5 is a partially enlarged view of Part B in FIG. 4.
Figure 6:
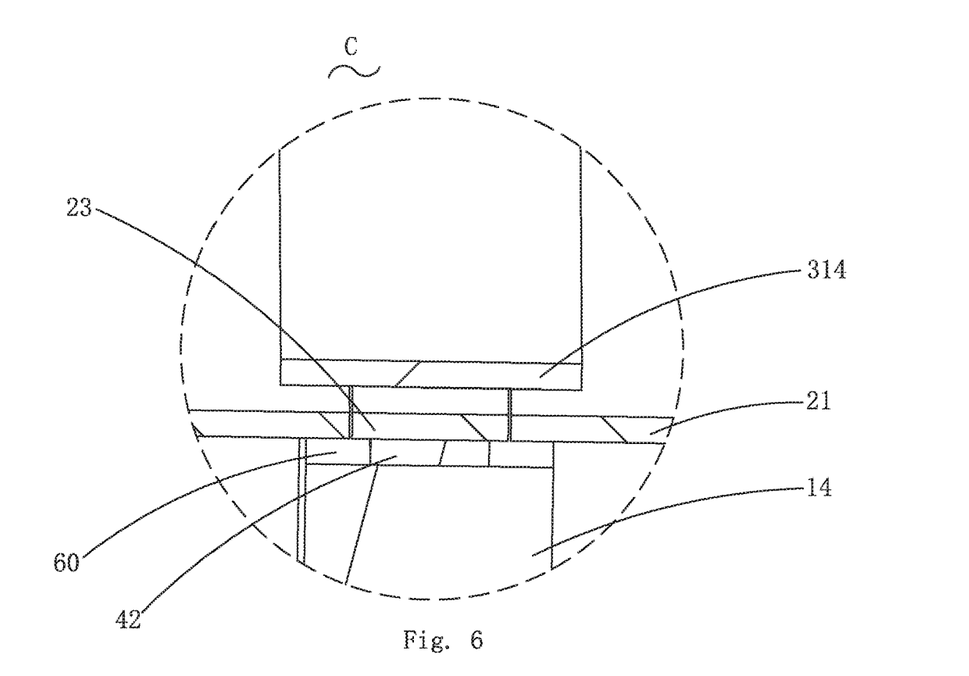
FIG. 6 is a partially enlarged view of Part C in FIG. 4.
Figure 7:
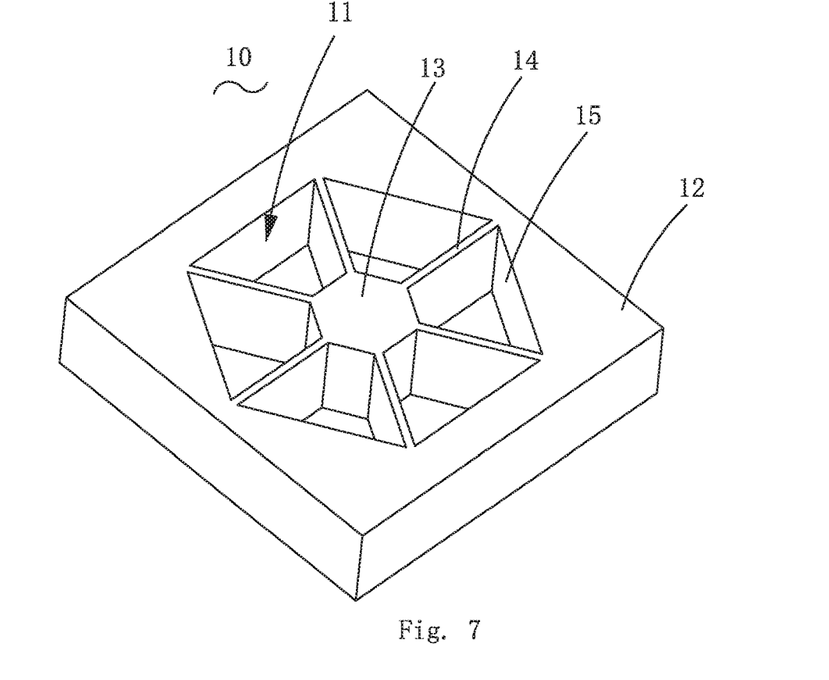
FIG. 7 is an isometric view of a base provided by the embodiment of the invention.
Figure 8:
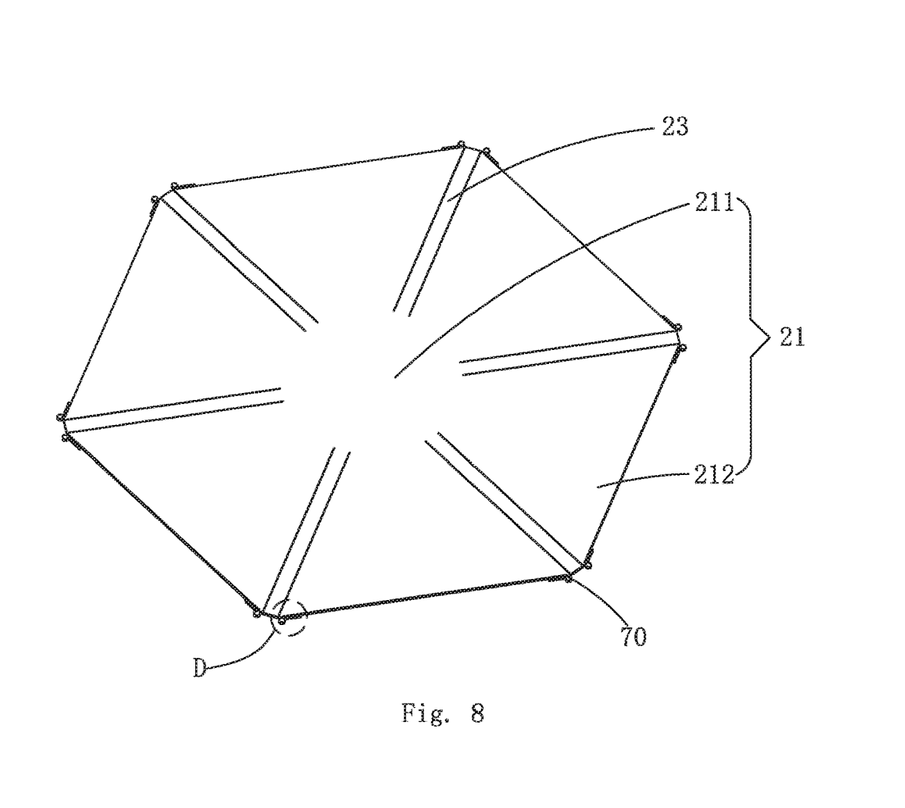
FIG. 8 is an isometric view of restraining elements, provided by the embodiment of the invention, arranged on a piezoelectric diaphragm.

Further referring to FIG. 8, the piezoelectric diaphragm 20 is of an integral structure. The piezoelectric diaphragm 20 is provided with breathable seams 22 extending from the outer edge thereof to the center of the piezoelectric diaphragm 20; and the breathable seams 22 divide the piezoelectric diaphragm 20 into the diaphragm sheets 21. Specifically, the piezoelectric diaphragm 20 comprises a plurality of diaphragm sheets 21, and a plurality of support parts 23 laid along the plurality of support beams 14 separately. Each diaphragm sheet 21 comprises a fixing end 211 connected with the support column 13 and a free end 212 connected with the fixing end 211 and suspended above one sub-cavity 15. In the embodiment, various diaphragm sheets 21 share one fixing end 211.

The specific structures of the fixing ends 211 and the diaphragm sheets 21 are not limited; the symmetry of the overall structure of the piezoelectric diaphragm 20 is also not limited; the diaphragm sheets 21 may be in a form of a symmetric or asymmetric polygon; and the side edges of the diaphragm sheets 21 may be straight lines or curves. One ends of the support parts 23 are connected with the fixing ends 211. One support part 23 is arranged between two adjacent diaphragm sheets 21. The support parts 23 and the free ends 212 are arranged at intervals; and the breathable seams 22 are formed between the support parts 23 and the free ends 212 of the diaphragm sheets 21 respectively.

As a preferred embodiment, the sizes of the free ends 212 on the diaphragm sheets 21 along the circumferential direction of the support column 13 are gradually increased towards the ring base 12 from the fixing ends 211. Under the sound pressure, the free ends 212 drives the diaphragm sheets 21 to vibrate, and the diaphragm sheets 21 close to the fixing ends 211 generate greater deformation under the action of force to generate more charge, therefore, the sensitivity thereof can be further improved.

In the embodiment, the number of the sub-cavities 15 corresponds to that of the diaphragm sheets 21, and one free end 212 is suspended above each sub-cavity 15. A projection profile of an inner side wall of the ring base 12 in the direction vertical to the diaphragm sheets 21 may be circular or polygonal; the number of the support beams 14 can be set as described in actual requirements; and the specific number is not limited.

When the projection profile of the inner side wall of the ring base 12 in the direction vertical to the diaphragm sheets 21 is polygonal, the number of the support beams 14 can be smaller than, equal to or greater than the number of vertices of the polygon. It should be noted that, two or more free ends 212 can also be suspended above each sub-cavity 15, and are specifically arranged as described in actual design requirements.

Figure 10:
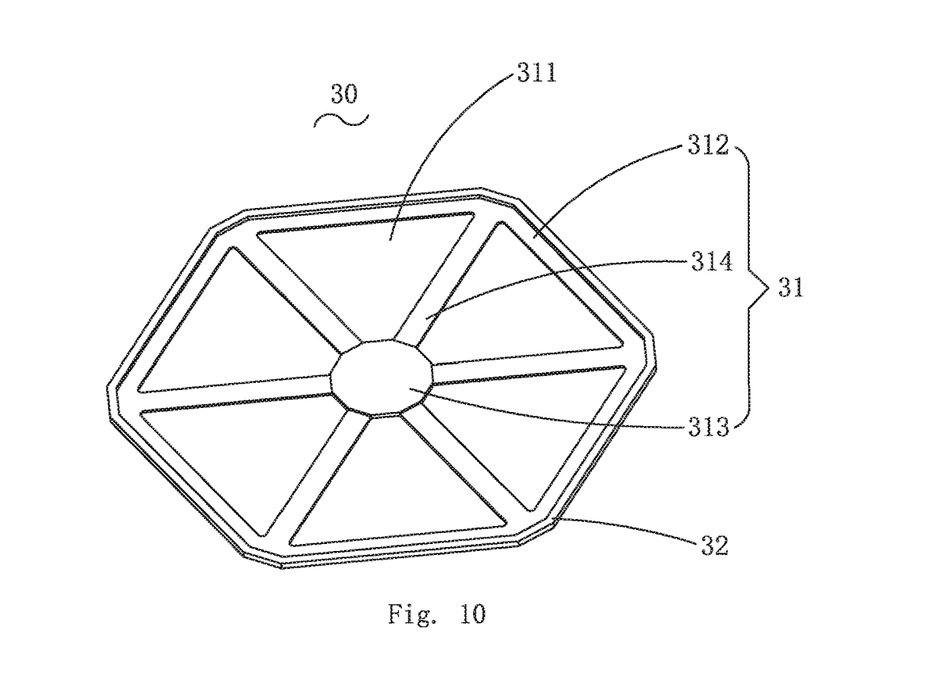
FIG. 10 is an isometric view of a limit element provided by the embodiment of the invention.
Figure 11:
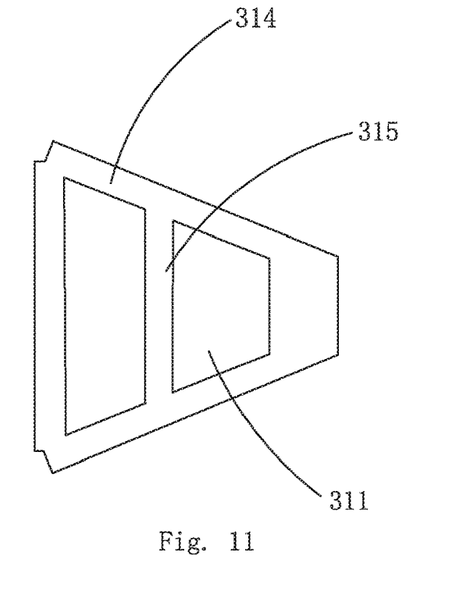
FIG. 11 is a partial top view I of blocking boards, provided by the embodiment of the invention, arranged on the limit element.
Figure 12:
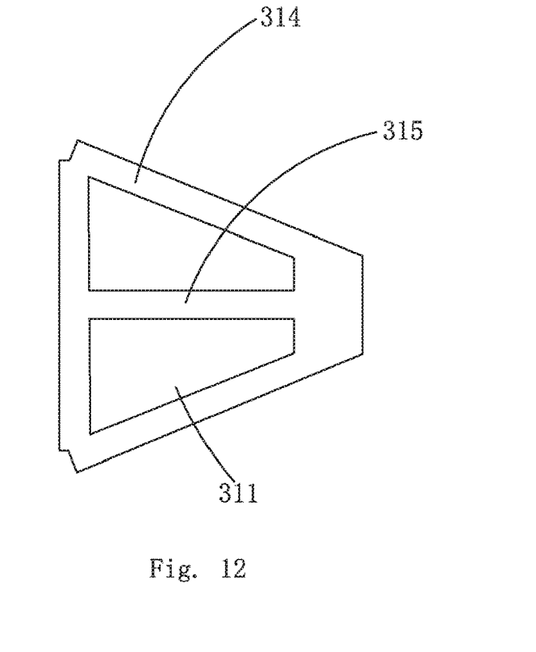
FIG. 12 is a partial top view II of the blocking boards, provided by the embodiment of the invention, arranged on the limit element.

Further referring to FIGS. 10 to 12, in the embodiment, the limit element 30 comprises a limit part 31 arranged apart from the piezoelectric diaphragm 20 to limit the free ends 212 in vibration directions of the diaphragm sheets 21, and an edge fixing plate 32 vertically connected with the outer edge of the limit part 31 and arranged on the ring base 12. The edge fixing plate 32 is connected to the base 10, so that the strength of the limit element 30 itself can be improved. A plurality of first through holes 311 are formed in the limit part 31 and are arranged directly opposite to various sub-cavities 15.

Specifically, the limit part 31 comprises a limit plate 312 extending towards the support column 13 from one side, far away from the ring base 12, of the edge fixing plate 32, and an intermediate fixing plate 313 connected with the support column 13, a plurality of support plates 314 separately arranged directly opposite to the plurality of support beams 14 in a manner of one-to-one correspondence, and a plurality of blocking boards 315 arranged at intervals.

In the embodiment, preferably, the limit plate 312 is of a ring structure; preferably, the support plates 314 are of a strip structure. The limit plate 312 covers a part of free ends 212. One end of each support plate 314 is connected with the limit plate 312 and the other end is connected with the intermediate fixing plate 313. Each support plate 314 covers a part of free ends 212. Under the impact force, when the diaphragm sheets 21 greatly deform upwards, limited by protection of the structure of the limit part 31, the deformation of the diaphragm sheets 21 can be controlled to protect the diaphragm sheets 21.

The intermediate fixing plate 313, two adjacent support plates 314 and the limit plate 312 define one first through hole 311. At least one blocking board 315 is suspended between the intermediate fixing plate 313 and the limit plate 312 above each diaphragm sheet 21, one ends of the blocking boards 315 are connected with the intermediate fixing plate 313 and the other ends of the blocking boards 315 are connected with the limit plate 312. Certainly, one blocking board 315 can also be arranged between two adjacent support plates 314, one end of each blocking board 315 is connected with one support plate 314 and the other end of the blocking board 315 is connected with another adjacent support plate 314; or other arrangement structures of the blocking boards 315 can be adopted. In practical application, the specific structure of the limit element 30 can be designed as described in actual requirements.

Figure 13:
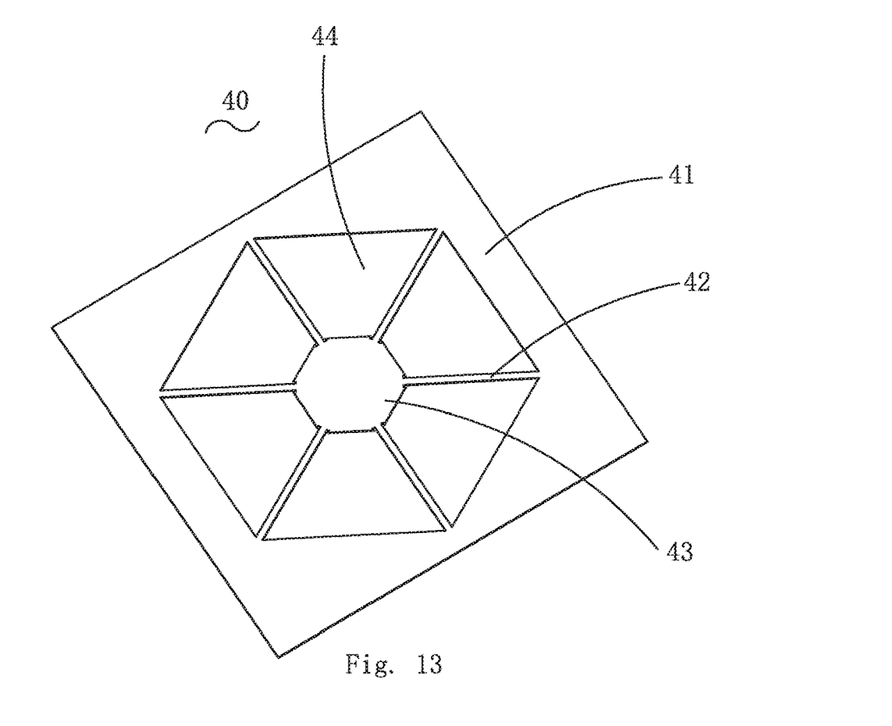
FIG. 13 is an isometric view of a gasket provided by the embodiment of the invention.

Further referring to FIG. 13, as a preferred embodiment, the piezoelectric MEMS microphone further comprises a gasket 40 arranged between the base 10 and the piezoelectric diaphragm 20. The gasket 40 comprises an edge fixing pad 41 arranged in a surrounding manner along an extension direction of the ring base 12, a plurality of support pads 42 laid along the plurality of support beams 14 separately and a middle fixed pad 43 arranged between the fixing ends 211 and the support column 13. One side, toward the fixing ends 211, of the intermediate fixing plate 313 is higher than the blocking boards 315, so that the intermediate fixing plate 313 can be propped against the fixing ends 211.

The edge fixing pad 41 is arranged on the ring base 12, and one side (inner side), close to the free ends 212, of the edge fixing pad 41 and the ring base 12 form a base avoidance zone 50. A projection of the outer edge of the piezoelectric diaphragm 20 on the base 10 is positioned within the projection of the outer edge of the base avoidance zone 50 on the base 10. One sides, far away from the fixing ends 211, of the free ends 212 cover the base avoidance zone 50, so as to restrain downward vibration of the diaphragm sheets 21.

The support pads 42 are separately arranged on the support beams 14; and two sides of the support pads 42 along the axial directions thereof and the support beams 14 form support beam avoidance zones 60 respectively, and the side parts of the free ends 212 cover the support beam avoidance zones 60. When the diaphragm sheets 21 greatly deform downwards, the edges of the free ends 212 are in contact with the base avoidance zone 50 or/and the support beam avoidance zones 60 to prevent the diaphragm sheets 21 from further deforming and to protect the diaphragm sheets 21.

The middle fixed pad 43 is arranged between the fixing ends 211 and the support column 13. One end of the support pads 42 are connected with the edge fixing pad 41 and the other ends of the support pads 42 is connected with the middle fixed pad 43; and the middle fixed pad 43, two support pads 42 and the edge fixing pad 41 define one second through hole 44 corresponding to one sub-cavity 15. The vibration of the piezoelectric diaphragm 20 is restrained from upper and lower directions; gaps of 1-2 microns exist between the piezoelectric diaphragm 20 and the bottom surface of the limit part 31 and between the piezoelectric diaphragm and the top surface of the base 10 respectively; and relative to that of the free ends 212 of the diaphragm sheets 21, the deformation of the gaps is within fracture deformation.

A design of the limit element 30 is determined by the structure of the piezoelectric diaphragm 20, and all structures playing protecting and limiting roles in upward swing of the piezoelectric diaphragm 20 are covered in the protection scope of the invention. The limit element 30 can protect and limit one or more edges of the diaphragm sheets 21, and can also protect the whole surface of the piezoelectric diaphragm 20. In the embodiment, the design of the piezoelectric diaphragm 20 is determined by the structure of the sub-cavities 15 and the structure of the gasket 40 jointly. Under the premise of no affecting the performance, the design of the sub-cavities 15 can be modified as described in the requirements for protection on the diaphragm sheets 21, and is not limited to the design in the embodiment.

Figure 9:
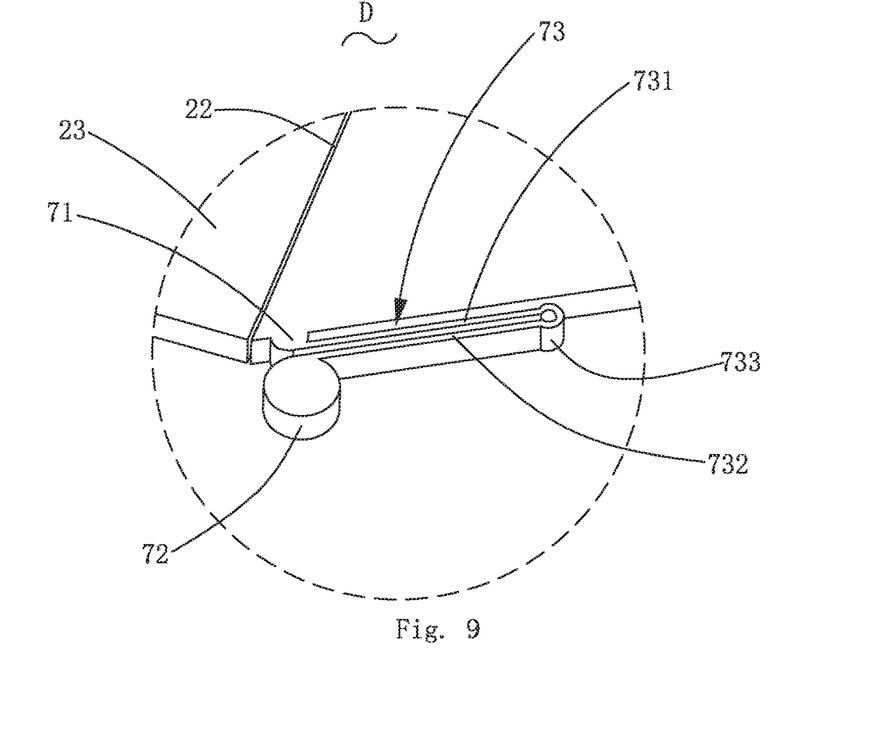
FIG. 9 is a partially enlarged view of Part D in FIG. 8.

Further referring to FIG. 9, as a preferred embodiment, the piezoelectric MEMS microphone further comprises restraining elements 70. One end of the restraining elements 70 are connected with the free ends 212 and the other ends of the restraining elements 70 are connected with the ring base 12 or the limit element 30 or the gasket 40. The restraining elements 70 can avoid different degrees of deformation, such as edge warping and inward rolling, of the diaphragm sheets 21 caused by residual stress in the diaphragm sheets 21, prevent a difference among the diaphragm sheets 21 during low-frequency attenuation and can restrain the deformation of the diaphragm sheets 21, thereby improving the resonance frequency of the piezoelectric diaphragm 20 and reducing noise of the whole piezoelectric MEMS microphone.

Particularly, if the restraining elements 70 are rigid restraining elements, the resonance frequency can be above 35 kHz in general, but the sensitivity is significantly reduced (below −44 dB), and the restraining elements 70 here can be replaced with the rigid restraining elements as described in actual use requirements.

In the embodiment, the restraining elements 70 are elastic restraining elements. Each restraining element 70 comprises a protruding part 71, a fixing column 72 and an elastic arm 73. The protruding parts 71 are connected with the free ends 212 on the diaphragm sheets 21. The fixing columns 72 are connected with the ring base 12 or the limit element 30 or the gasket 40; and specifically, the fixing columns 72 are connected with the ring base 12. One ends of the elastic arms 73 are connected with the protruding parts 71 and the other ends of the elastic arms 73 are connected with the fixing columns 72.

Each elastic arm 73 comprises a first support arm 731, a second support arm 732 and a curved connecting arm 733. The first support arms 731 are connected with the protruding parts 71. The second support arms 732 are connected with the fixing columns 72. One ends of the curved connecting arms 733 are connected with the first support arms 731 and the other ends of the curved connecting arms 733 are connected with the second support arms 732. The first support arms 731 and the second support arms 732 are arranged in parallel, so that the restraining elements 70 have elasticity.

As a preferred embodiment, each diaphragm sheet 21 is connected with two restraining elements 70, and one restraining element 70 is arranged at each of two ends of one side, toward the ring base 12, of each diaphragm sheet 21, so as to make the diaphragm sheet 21 smoother in vibration.

Elastic coefficients of the restraining elements 70 can be adjusted through the design of the structure of the piezoelectric diaphragm 20, so as to affect the resonance frequency, sensitivity and noise floors of the piezoelectric MEMS microphone. When the elastic coefficients of the restraining elements 70 are increased, the restraint effect will be better, the resonance frequency will be significantly increased, the noise will be reduced, but the sensitivity well be reduced. On the contrary, the elastic coefficients will be reduced, the restraint effect will become bad, the resonance frequency will be significantly reduced, but the sensitivity will by obviously improved. In a practical design, the design should be performed as described in the sensitivity, a signal-to-noise ratio, the resonance frequency and the like required by a product.

Through multiple experiments, the restraining elements 70 can effectively release the residual stress formed by the diaphragm sheets 21 in a processing technology. The warping deformation of the diaphragm sheets 21 can be better controlled, the maximum deformation is smaller than 50 nm, and the influence on the low-frequency attenuation of the piezoelectric MEMS microphone caused by the deformation amount on can be ignored.

Specific designs of the restraining elements 70 are not limited, and all structures capable of playing elastic connecting and restraining roles are within the scope of the invention.

The number, positions and symmetry of distribution of the restraining elements 70 are not limited, and can be determined by the design of cantilever beam diaphragm sheets 21 and parameters of the piezoelectric MEMS microphone jointly. For restraint structures, all designs of free vibration ends of which one ends are connected with the base 10 and the other ends are connected with the diaphragm sheets 21 are within the scope of the invention. The free ends 212 may be all edges expect for the fixing ends 211, including long edges and the side edges.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A piezoelectric micro-electromechanical system (MEMS) microphone, comprising:
   a base with a cavity, including a ring base, and a support column arranged apart from the ring base and located at an inner side of the ring base;
   a piezoelectric diaphragm arranged on the base, including a plurality of diaphragm sheets each having a fixing end connected with the support column and a free end suspended above the cavity;
   a limit element covering outside the piezoelectric diaphragm, comprising a limit part arranged apart from the piezoelectric diaphragm for limiting the free ends in a vibration direction of the diaphragm, and an edge fixing plate connected with the outer edge of the limit part and arranged on the ring base;
   and a plurality of first through holes formed in the limit part for being arranged opposite to the cavity.

2. The piezoelectric MEMS microphone as described in claim 1, wherein the base further comprises a plurality of support beams; one ends of the support beams are connected with the support column, and the other ends are connected with the ring base for dividing the cavity into a plurality of sub-cavities.

3. The piezoelectric MEMS microphone as described in claim 2, wherein the piezoelectric diaphragm is of an integral structure; the piezoelectric diaphragm is provided with breathable seams extending from the outer edge thereof to the center of the piezoelectric diaphragm; and the breathable seams divide the piezoelectric diaphragm into diaphragm sheets.

4. The piezoelectric MEMS microphone as described in claim 2, wherein the limit part comprises a limit plate extending towards the support column from one side of the edge fixing plate far away from the ring base; and the limit plate covers a part of free ends.

5. The piezoelectric MEMS microphone as described in claim 4, wherein the limit part further comprises an intermediate fixing plate connected with the support column, and a plurality of support plates separately arranged directly opposite to the plurality of support beams in a manner of one-to-one correspondence; one end of each support plate is connected with the limit plate and the other end is connected with the intermediate fixing plate; each support plate covers a part of free ends; and the intermediate fixing plate, two adjacent support plates and the limit plate define one first through hole.

6. The piezoelectric MEMS microphone as described in claim 5 further including one blocking board arranged between the intermediate fixing plate and the limit plate above each diaphragm sheet, wherein one end of each blocking board is connected with the intermediate fixing plate and the other end is connected with the limit plate.

7. The piezoelectric MEMS microphone as described in claim 5 further including one blocking board is arranged between two adjacent support plates above each diaphragm sheet, one end of each blocking board is connected with one support plate and the other end is connected with another adjacent support plate.

8. The piezoelectric MEMS microphone as described in claim 5, further comprising a gasket arranged between the base and the piezoelectric diaphragm, wherein the gasket comprises an edge fixing pad arranged in a surrounding manner along an extension direction of the ring base; the inner side of the edge fixing pad and the ring base form a base avoidance zone; a projection of the outer edge of the piezoelectric diaphragm on the base is positioned within the projection of the outer edge of the base avoidance zone on the base.

9. The piezoelectric MEMS microphone as described in claim 6, wherein the gasket further comprises a plurality of support pads laid along the plurality of support beams separately; two sides of the support pads along the axial directions thereof and the support beams form support beam avoidance zones respectively; and the side parts of the free ends separately cover the support beam avoidance zones.

10. The piezoelectric MEMS microphone as described in claim 7, wherein the gasket further comprises a plurality of support pads laid along the plurality of support beams separately; two sides of the support pads along the axial directions thereof and the support beams form support beam avoidance zones respectively; and the side parts of the free ends separately cover the support beam avoidance zones.

11. The piezoelectric MEMS microphone as described in claim 9, wherein the gasket further comprises a middle fixed pad arranged between the intermediate fixing plate and the support column; one ends of the support pads are connected with the edge fixing pad and the other ends are connected with the middle fixed pad; and the middle fixed pad, two adjacent support pads and the edge fixing pad define one second through hole corresponding to one sub-cavity.

12. The piezoelectric MEMS microphone as described in claim 10, wherein the gasket further comprises a middle fixed pad arranged between the intermediate fixing plate and the support column; one ends of the support pads are connected with the edge fixing pad and the other ends are connected with the middle fixed pad; and the middle fixed pad, two adjacent support pads and the edge fixing pad define one second through hole corresponding to one sub-cavity.

13. The piezoelectric MEMS microphone as described in claim 6, further comprising a plurality of restraining elements, wherein one ends of the restraining elements are connected with the free ends; and the other ends are connected with the ring base or the limit element or the gasket.

14. The piezoelectric MEMS microphone as described in claim 7, further comprising a plurality of restraining elements, wherein one ends of the restraining elements are connected with the free ends; and the other ends are connected with the ring base or the limit element or the gasket.

* * * * *